(12) United States Patent
Iduka et al.

(10) Patent No.: US 8,729,592 B2
(45) Date of Patent: May 20, 2014

(54) SEMICONDUCTOR LIGHT EMITTING DEVICE

(75) Inventors: Miyuki Iduka, Kanagawa (JP); Yosuke Akimoto, Kanagawa-ken (JP); Akihiro Kojima, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 810 days.

(21) Appl. No.: 12/886,092

(22) Filed: Sep. 20, 2010

(65) Prior Publication Data

US 2011/0284910 A1 Nov. 24, 2011

(30) Foreign Application Priority Data

May 24, 2010 (JP) .................................. 2010-118697

(51) Int. Cl.
*H01L 33/00* (2010.01)
(52) U.S. Cl.
USPC ................ 257/99; 257/778; 438/46; 438/666
(58) Field of Classification Search
None
See application file for complete search history.

(56) References Cited

U.S. PATENT DOCUMENTS

| | | | | |
|---|---|---|---|---|
| 5,798,536 | A * | 8/1998 | Tsutsui ............................ | 257/99 |
| 7,179,670 | B2 * | 2/2007 | Shelton et al. ................... | 438/26 |
| 2002/0017651 | A1 * | 2/2002 | Kato et al. ....................... | 257/89 |
| 2005/0194605 | A1 | 9/2005 | Shelton et al. | |
| 2006/0169994 | A1 | 8/2006 | Tu et al. | |
| 2006/0231852 | A1 * | 10/2006 | Kususe et al. .................... | 257/99 |
| 2007/0034855 | A1 | 2/2007 | Hwang et al. | |
| 2007/0284593 | A1 | 12/2007 | Ko et al. | |
| 2009/0283787 | A1 | 11/2009 | Donofrio et al. | |
| 2009/0289273 | A1 | 11/2009 | Tsai et al. | |
| 2010/0059733 | A1 | 3/2010 | Shei et al. | |
| 2010/0148198 | A1 | 6/2010 | Sugizaki et al. | |
| 2011/0220931 | A1 | 9/2011 | Kojima | |

FOREIGN PATENT DOCUMENTS

| | | |
|---|---|---|
| JP | 05021845 | 1/1993 |
| JP | 08330631 | 12/1996 |
| JP | H11-150300 A | 6/1999 |
| JP | 2000-150958 | 5/2000 |

(Continued)

OTHER PUBLICATIONS

European Examination Report mailed Apr. 8, 2013 for European Application No. 10186525.1.
Japanese Office Action issued on May 2, 2013 in the counterpart Japanese patent application No. 2010-118697, and English translation thereof.

(Continued)

*Primary Examiner* — Andres Munoz
(74) *Attorney, Agent, or Firm* — White & Case LLP

(57) ABSTRACT

According to one embodiment, a semiconductor light emitting device includes a semiconductor layer, a first electrode, a second electrode, a first insulating layer, a first interconnect layer, a second interconnect layer, a first metal pillar, a second metal pillar, and a second insulating layer. The first electrode is provided on the second major surface of the semiconductor layer. The second electrode is provided on a side face of a portion of the semiconductor layer between the light emitting layer and the first major surface. The second interconnect layer is provided in the second opening and on the first insulating layer on the side opposite to the second major surface to connect to the second electrode provided on the side face. The second interconnect layer is provided on the side face of the portion of the semiconductor layer with interposing the second electrode.

11 Claims, 14 Drawing Sheets

(56) References Cited

FOREIGN PATENT DOCUMENTS

| | | |
|---|---|---|
| JP | 2002-232006 A | 8/2002 |
| JP | 2002-353503 A | 12/2002 |
| JP | 2003-282957 A | 10/2003 |
| JP | 2007-184316 A | 7/2007 |
| JP | 2007-288097 A | 11/2007 |
| WO | 2008026902 A1 | 3/2008 |
| WO | 2008/131736 A1 | 11/2008 |
| WO | 2009/064330 A2 | 5/2009 |

OTHER PUBLICATIONS

Partial European Search Report for European Patent Application Serial No. 10186525.1 mailed on Jun. 8, 2011.
European Examination Report mailed Aug. 22, 2012 for European Application No. 10186525.1.
Extended European Search Report for European Patent Application Serial No. 10186525.1 mailed on Sep. 29, 2011.
Taiwanese Office Action issued on Sep. 12, 2013 in corresponding TW Application No. 099130334, along with English translation thereof.

* cited by examiner

SEMICONDUCTOR LIGHT EMITTING DEVICE

CROSS-REFERENCE TO RELATED APPLICATION

This application is based upon and claims the benefit of priority from Japanese Patent Application No. 2010-118697, filed on May 24, 2010; the entire contents of which are incorporated herein by reference.

FIELD

Embodiments described herein relate generally to a semiconductor light emitting device.

BACKGROUND

In a known structure, an n-side electrode and a p-side electrode are formed on one major surface side of the semiconductor layer. By relatively increasing the planar surface area of the p-side electrode in such a structure, the light emission surface area can be increased and the luminance can be increased. However, in the case where the planar surface area of the p-side electrode is increased without changing the chip size (the planar size), the planar surface area of the n-side electrode is relatively reduced. In the case where the planar surface area of the n-side electrode is reduced, the reliability may decrease due to current concentration in the n-side electrode.

DETAILED DESCRIPTION

Figure 1A:
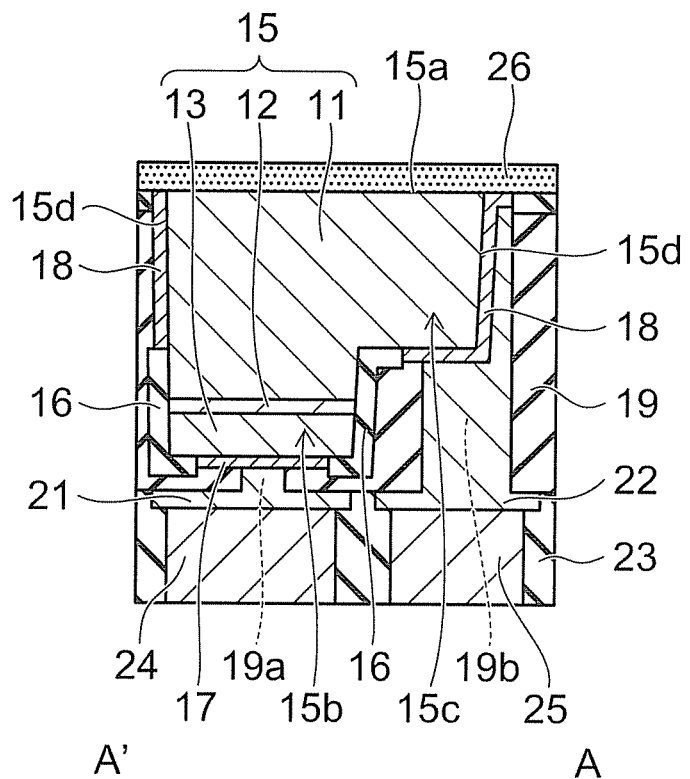
FIGS. 1A and 1B are schematic views of a semiconductor light emitting device of a first embodiment.

According to one embodiment, a semiconductor light emitting device includes a semiconductor layer, a first electrode, a second electrode, a first insulating layer, a first interconnect layer, a second interconnect layer, a first metal pillar, a second metal pillar, and a second insulating layer. The semiconductor layer includes a light emitting layer, a first major surface, and a second major surface opposite to the first major surface. The first electrode is provided on the second major surface of the semiconductor layer. The second electrode is provided on a side face of a portion of the semiconductor layer between the light emitting layer and the first major surface. The first insulating layer is provided on a side of the second major surface of the semiconductor layer. The first insulating layer has a first opening reaching the first electrode and a second opening reaching the second electrode provided on the side face. The first interconnect layer is provided in the first opening and on the first insulating layer on a side opposite to the second major surface to connect to the first electrode. The second interconnect layer is provided in the second opening and on the first insulating layer on the side opposite to the second major surface to connect to the second electrode provided on the side face. The second interconnect layer is provided on the side face of the portion of the semiconductor layer with interposing the second electrode. The first metal pillar is provided on a face of the first interconnect layer on a side opposite to the first electrode. The second metal pillar is provided on a face of the second interconnect layer on a side opposite to the second electrode. The second insulating layer covers a periphery of the first metal pillar and a periphery of the second metal pillar.

Exemplary embodiments will now be described with reference to the drawings. Similar components in the drawings are marked with like reference numerals.

First Embodiment

Figure 1B:
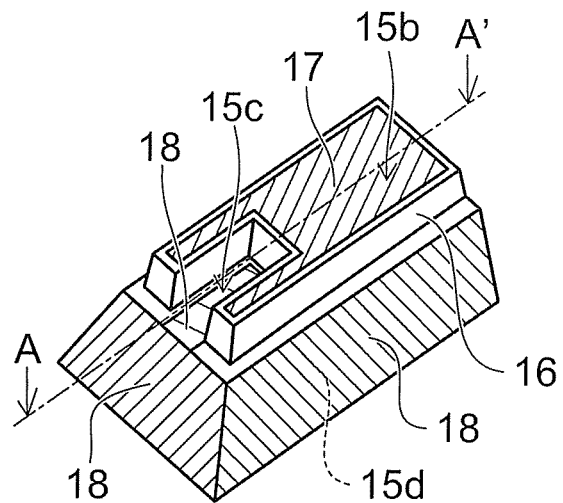

FIG. 1A is a schematic cross-sectional view taken along A-A' line in FIG. 1B of a semiconductor light emitting device of a first embodiment. FIG. 1B is a schematic perspective view of a semiconductor layer 15 and electrodes 17 and 18 of the semiconductor light emitting device. In FIG. 1A, a first major surface 15a of the semiconductor layer 15 is illustrated on the upper side; and in FIG. 1B, the first major surface 15a is illustrated on the lower side.

The semiconductor layer 15 includes a first semiconductor layer 11 and a second semiconductor layer 13. The first semiconductor layer 11 is, for example, an n-type GaN layer that functions as a lateral current path. However, the conductivity type of the first semiconductor layer 11 is not limited to the n-type; and the conductivity type may be a p-type. The semiconductor layer 15 includes a light emitting layer (an active layer) 12 and, for example, a p-type GaN layer and an n-type GaN layer with the light emitting layer 12 interposed therebetween. The second semiconductor layer 13 is provided on the side opposite to the first major surface 15a. Light is mainly extracted from the first major surface 15a of the semiconductor layer 15.

A second major surface side of the semiconductor layer 15 on the side opposite to the first major surface 15a is patterned into a recessed and protruding configuration; and an upper level portion 15b and a lower level portion 15c are provided on the second major surface side. The upper level portion 15b is positioned more on the upper level side than is the lower level portion 15c as viewed from the first major surface 15a.

The upper level portion 15b includes the light emitting layer 12. The lower level portion 15c does not include the light emitting layer 12 and is provided in the portion between the light emitting layer 12 and the first major surface 15a.

The p-side electrode 17 is provided as a first electrode on the second major surface of the upper level portion 15b (the surface of the second semiconductor layer 13).

The n-side electrode 18 is provided as a second electrode on the second major surface of the lower level portion 15c (the surface of the first semiconductor layer 11). The n-side electrode 18 is provided also on a side face 15d of the lower level portion 15c. The n-side electrode 18 formed on the side face 15d and the n-side electrode 18 formed on the surface of the lower level portion 15c (the second major surface) are formed as a single body from the same material and are joined at the corner between the side face 15d and the surface of the lower level portion 15c. The n-side electrode 18 formed on the side face 15d encloses the outer circumference of the lower level portion 15c, that is, is formed to be continuously formed on the side face 15d. The surface area of the portion of the n-side electrode 18 provided on the side face 15d is greater than the surface area of the portion of the n-side electrode 18 provided on the second major surface. The n-side electrode 18 surrounds the side surfaces 15d of the n-type semiconductor layer 11.

The p-side electrode 17 is formed on the surface of the upper level portion 15b in a region (a light emitting region) in the surface direction of the semiconductor layer 15 including the light emitting layer 12. The surface area of the p-side electrode 17 on the second major surface is greater than the surface area of the n-side electrode 18 formed on the surface (on the second major surface) of the lower level portion 15c.

An insulating film 16 such as, for example, a silicon oxide film is provided on the side face of the upper level portion 15b; and the insulating film 16 covers the side face of the light emitting layer 12. The insulating film 16 is interposed between the p-side electrode 17 and the n-side electrode 18 to insulatively separate the p-side electrode 17 and the n-side electrode 18.

The second major surface and the side face 15d of the semiconductor layer 15 are covered with an insulating layer (a first insulating layer) 19. The insulating layer 19 is, for example, a resin or a silicon oxide film.

The face of the insulating layer 19 on the side opposite to the second major surface is planarized; a p-side interconnect layer 21 is provided on the face as a first interconnect layer; and an n-side interconnect layer 22 is provided on the face as a second interconnect layer. The face of the n-side interconnect layer 22 on the side opposite to the face of the n-side interconnect layer 22 connected to the n-side electrode 18 on the lower level portion 15c surface (the second major surface) is larger than the face connected to the n-side electrode 18 on the lower level portion 15c surface. In other words, the layout of the n-side interconnect layer 22 on the insulating layer 19 has a surface area greater than that of the n-side electrode 18 on the lower level portion 15c surface.

The p-side interconnect layer 21 is provided also in a first opening 19a made in the insulating layer 19 to reach the p-side electrode 17; and the p-side interconnect layer 21 is connected to the p-side electrode 17.

A second opening 19b is made in the insulating layer 19 to reach the n-side electrode 18. The second opening 19b is made to reach the n-side electrode 18 on the surface of the lower level portion 15c and is made in a portion beside the n-side electrode 18 formed on the side face 15d. Accordingly, the second opening 19b communicates with the n-side electrode 18 formed on the side face 15d. The n-side interconnect layer 22 is provided also in the second opening 19b. In other words, the n-side interconnect layer 22 is provided also in the portion beside the n-side electrode 18 formed on the side face 15d. Accordingly, the n-side interconnect layer 22 is connected to the n-side electrode 18 provided on the side face 15d and on the surface of the lower level portion 15c.

The side face 15d is tapered with respect to the first major surface 15a and the second major surface. The width of the portion of the second opening 19b beside the side face 15d gradually increases from the first major surface 15a side toward the second major surface side. Therefore, the fillability of the n-side interconnect layer 22 into the portion beside the side face 15d is good; and the n-side interconnect layer 22 can be reliably connected to the n-side electrode 18 provided on the side face 15d.

A p-side metal pillar 24 is provided as the first metal pillar on the face of the p-side interconnect layer 21 on the side opposite to the p-side electrode 17. An n-side metal pillar 25 is provided as a second metal pillar on the face of the n-side interconnect layer 22 on the side opposite to the n-side electrode 18 on the second major surface.

A resin layer 23, for example, covers the periphery of the p-side metal pillar 24, the periphery of the n-side metal pillar 25, a portion of the p-side interconnect layer 21, and a portion of the n-side interconnect layer 22 as the second insulating layer, respectively. The second insulating layer may be an inorganic layer.

Figure 2:
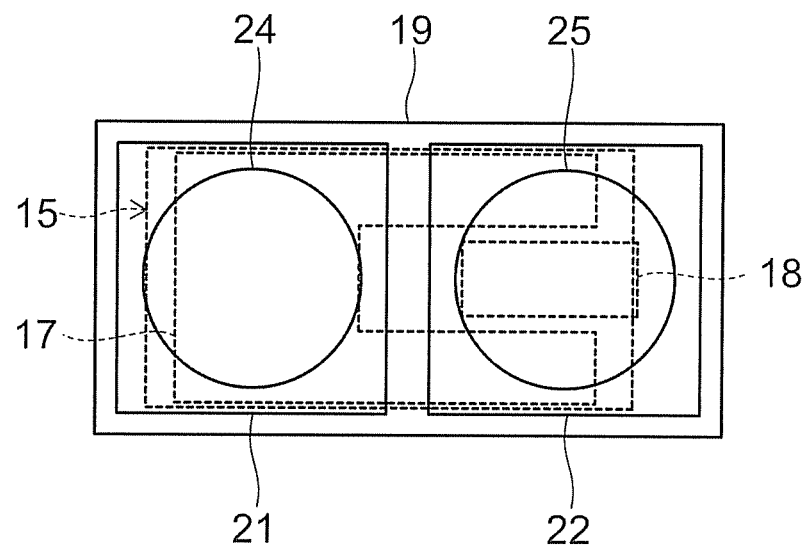
FIG. 2 is a schematic plane view illustrating a planar layout of electrodes, interconnect layers, and metal pillars of the semiconductor light emitting device of the first embodiment.

FIG. 2 illustrates one example of a planar layout of the semiconductor layer 15, the p-side electrode 17, the n-side electrode 18, the p-side interconnect layer 21, the n-side interconnect layer 22, the p-side metal pillar 24, and the n-side metal pillar 25. FIG. 2 corresponds to a plan view of FIG. 1A as viewed from the lower face (the mounting surface) side. The resin layer 23 is not illustrated.

The semiconductor light emitting device has a rectangular shape in a plan view, as shown in FIG. 2.

The layout of the p-side electrode 17 (shown a broken line in FIG. 2) on the second major surface of the semiconductor layer 15 has a surface area greater than that of the n-side electrode 18 (shown a broken line in FIG. 2). The p-side electrode 17 has a U shape. The n-side electrode 18 is provided between the opening of the U shape. The planar size of the insulating layer 19 is larger than the planar size of the semiconductor layer 15. The layout of the p-side interconnect layer 21 (shown a solid line in FIG. 2) is in a region of about one half of the lower face of the insulating layer 19, and the layout of the n-side interconnect layer 22 (shown a solid line in FIG. 2) is in a region of about the remaining half. The n-side interconnect layer 22 is formed to spread over the insulating layer 19 with a surface area greater than that of the portion of the n-side electrode 18 provided on the second major surface.

The planar shape of the p-side interconnect layer 21 and the n-side interconnect layer 22 has a square shape or rectangular shape.

The configurations of the metal pillars 24 and 25 are not limited to circular columnar configurations. The surface areas of the metal pillars 24 and 25 are same in a plan view. The metal pillars 24 and 25 are symmetric with a center line perpendicular to a longitudinal direction. Further the metal pillars 24 and 25 are symmetric with respect to a center in a plan view. Prismatic configurations, columnar configurations having other shapes, or pad configurations may be used.

The first semiconductor layer 11 is electrically connected to the n-side metal pillar 25 via the n-side electrode 18 and the n-side interconnect layer 22. The second semiconductor layer 13 is electrically connected to the p-side metal pillar 24 via the p-side electrode 17 and the p-side interconnect layer 21. External terminals such as, for example, solder balls, metal bumps, etc., are provided on the lower end faces of the n-side metal pillar 25 and the p-side metal pillar 24 exposed from the resin layer 23. The semiconductor light emitting device is electrically connectable to an external circuit via the external terminals.

The p-side interconnect layer 21 and the n-side interconnect layer 22 have a same planar shape as in FIG. 2. Further the surface areas of the p-side interconnect layer 21 and the n-side interconnect layer 22 are same. The p-side interconnect layer 21 and the n-side interconnect layer 22 are symmetric with a center line perpendicular to a longitudinal direction. Distances from the p-side interconnect layer 21 and the n-side interconnect layer 22 to short side lines (left outline and right outline in FIG. 2) are same. Further the p-side interconnect layer 21 and the n-side interconnect layer 22 are symmetric with respect to a center in a plan view.

The p-side interconnect layer 21 and the n-side interconnect layer 22 are symmetric with respect to a center and the metal pillars 24 and 25 are symmetric with respect to the center in a plan view. Therefore, the semiconductor light emitting device has a stability and rarely topples (inclines).

Each of the thickness of the n-side metal pillar 25 and the thickness of the p-side metal pillar 24 (the thickness in the vertical direction of FIG. 1A) is thicker than the thickness of a stacked body including the semiconductor layer 15, the n-side electrode 18, the p-side electrode 17, the insulating film 16, the insulating layer 19, the n-side interconnect layer 22, and the p-side interconnect layer 21. The aspect ratios (the ratio of the thickness to the planar size) of the metal pillars 24 and 25 are not limited to being 1 or more; and the ratios may be less than 1. In other words, the thicknesses of the metal pillars 24 and 25 may be smaller than the planar sizes thereof.

According to the structure of this embodiment, it is possible to maintain the mechanical strength even in the case where the semiconductor layer 15 is thin by making the n-side metal pillar 25, the p-side metal pillar 24, and the resin layer 23 thick. In the case of mounting on a circuit board and the like, the n-side metal pillar 25 and the p-side metal pillar 24 can absorb and mitigate the stress applied to the semiconductor layer 15 via the external terminals.

The materials of the n-side interconnect layer 22, the p-side interconnect layer 21, the n-side metal pillar 25, and the p-side metal pillar 24 may include copper, gold, nickel, silver, etc. Thereof, copper may be favorable because copper provides good thermal conductivity, high migration resistance, and excellent adhesion with insulating films.

The resin layer 23, which performs the role of reinforcing the n-side metal pillar 25 and the p-side metal pillar 24, may be a substance having a coefficient of thermal expansion equal to or near that of the circuit board the like. Examples of such a resin layer 23 may include, for example, epoxy resin, silicone resin, fluorocarbon resin, etc.

A fluorescent layer 26 is provided on the first major surface 15a of the semiconductor layer 15. The fluorescent layer 26 is capable of absorbing light from the light emitting layer 12 and emitting wavelength-converted light. Therefore, it is possible to emit mixed light of the light from the light emitting layer 12 and the wavelength-converted light of the fluorescent layer 26. In the case where, for example, the light emitting layer 12 is nitride-based, it is possible to obtain white light, lamp light, etc., as mixed-color light of blue light from the light emitting layer 12 and yellow light from, for example, the wavelength-converted light of a yellow fluorescent layer 26. The fluorescent layer 26 may have a configuration including multiple types of fluorescers (e.g., a red fluorescer and a green fluorescer).

The light emitted by the light emitting layer 12 mainly travels through the first semiconductor layer 11, the first major surface 15a, and the fluorescent layer 26 to be emitted externally.

In structures in which the n-side electrode and the p-side electrode are formed on one major surface side of the semiconductor layer, the light emission surface area can be increased and the luminous efficacy can be increased by relatively increasing the planar surface area of the p-side electrode formed in the region including the light emitting layer. However, in the case where the planar surface area of the p-side electrode is increased without changing the chip size (the planar size), the planar surface area of the n-side electrode is relatively reduced. In the case where the planar surface area of the n-side electrode is reduced, there is a risk that the reliability may decrease due to current concentration in the n-side electrode.

However, in this embodiment, the n-side electrode 18 is formed also on the side face 15d of the semiconductor layer 11. Thereby, the surface area of the n-side electrode 18 contacting the first semiconductor layer 11 which is an n-type layer can be increased without reducing the surface area of the p-side electrode 17 on the second major surface. Accordingly, the surface area reduction of the p-side electrode 17 can be suppressed; the luminance can be increased; and the reliability can be increased by increasing the surface area of the n-side electrode 18. Further, an increase of the chip size can be suppressed.

On the second major surface of the semiconductor layer 15 as illustrated in FIG. 1B, the surface area of the p-side electrode 17 formed in the region including the light emitting layer 12 is greater than the surface area (the surface area on the second major surface) of the n-side electrode 18; and a larger light emitting region can be ensured.

In the mounting surface as illustrated in FIG. 2, the p-side and the n-side are formed with substantially the same surface area; and current can be supplied efficiently.

The n-side electrode 18 is made of a metal having light-shielding properties with respect to the light emitted by the light emitting layer 12. Accordingly, a structure is provided in which the side face 15d of the semiconductor layer 15 is covered with a light-shielding film. Therefore, light leakage from the side face 15d can be prevented; and uneven colors and uneven luminance can be suppressed. Further, the metal forming the n-side electrode 18 is reflective with respect to the light emitted by the light emitting layer. Therefore, the amount of the light reflected from the side face and extracted from the first major surface 15a side can be increased; and the luminance can be increased.

A method for manufacturing the semiconductor light emitting device of this embodiment will now be described with reference to FIG. 3A to FIG. 7B.

Figure 3A:
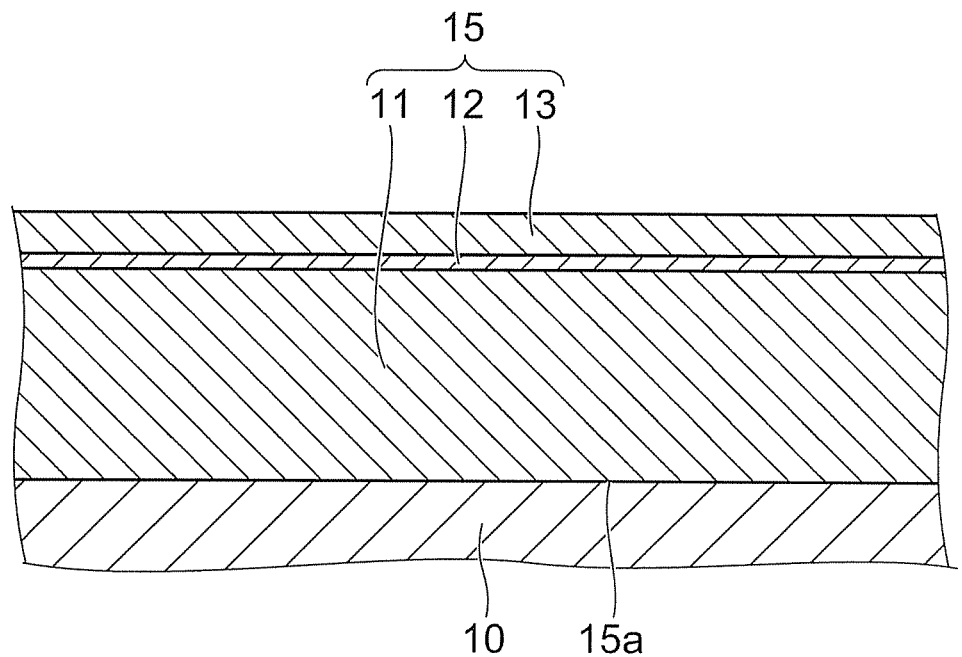
FIG. 3A to FIG. 7B are schematic cross-sectional views illustrating a method for manufacturing the semiconductor light emitting device of the first embodiment.

As illustrated in FIG. 3A, the first semiconductor layer 11 is grown on the major surface of a substrate 10; and the light emitting layer 12 and the second semiconductor layer 13 are grown thereupon. In the case where such layers of the semiconductor layer 15 are, for example, nitride semiconductors, the semiconductor layer 15 may be formed by, for example, crystal growth on a sapphire substrate.

Figure 3B:
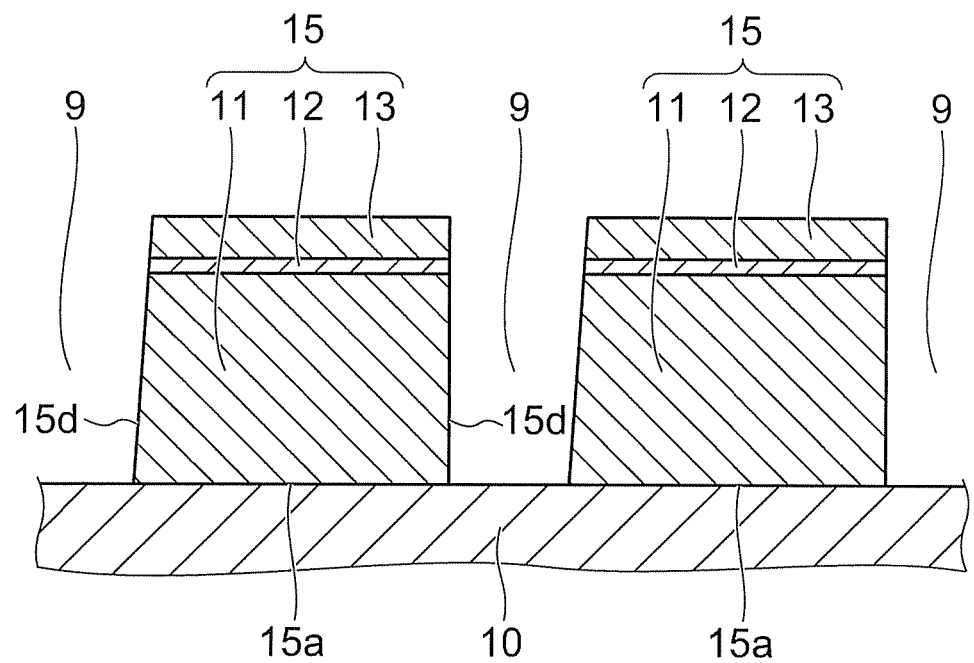

Then, as illustrated in FIG. 3B, a separating trench 9 is made to pierce the semiconductor layer 15 and reach the substrate 10 by, for example, Reactive Ion Etching (RIE) using a not-illustrated resist as a mask. The separating trench 9 is made, for example, in a lattice configuration on the substrate 10 to multiply separate the semiconductor layer 15.

Figure 4A:
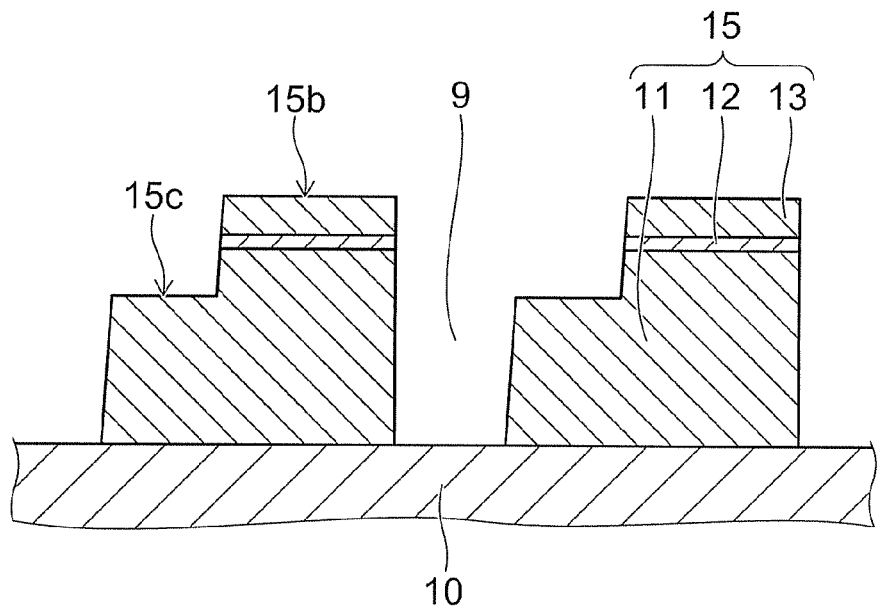

Then, a portion of the second semiconductor layer 13 and a portion of the light emitting layer 12 is removed by, for example, RIE using a not-illustrated resist to expose a portion of the first semiconductor layer 11 as illustrated in FIG. 4A. Thereby, the upper level portion 15b is formed on the second major surface side of the semiconductor layer 15 and positioned relatively in the upper level as viewed from the substrate 10; and the lower level portion 15c is formed on the second major surface side of the semiconductor layer 15 and positioned more in the lower level on the substrate 10 side than is the upper level portion 15b. The upper level portion 15b includes the light emitting layer 12; and the lower level portion 15c does not include the light emitting layer 12.

Figure 4B:
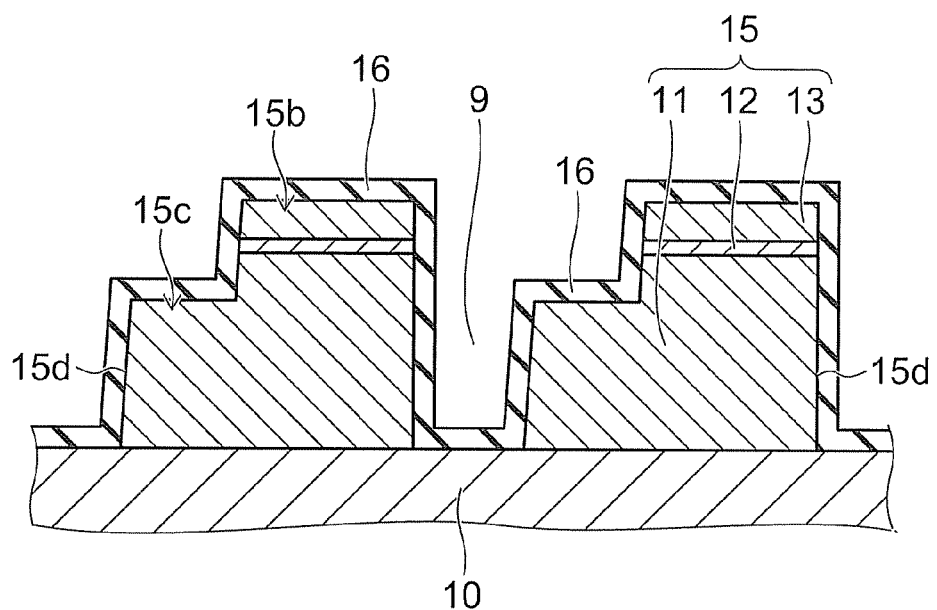

Continuing as illustrated in FIG. 4B, the insulating film 16 made of a silicon oxide film or the like is formed on all exposed faces of the substrate 10 by, for example, chemical vapor deposition (CVD). The insulating film 16 covers exposed surface of the semiconductor layer 15 including the side face 15d and the second major surface of the semiconductor layer 15. And the insulating film 16 also is formed on the side face and the bottom face of the separating trench 9.

Figure 5A:
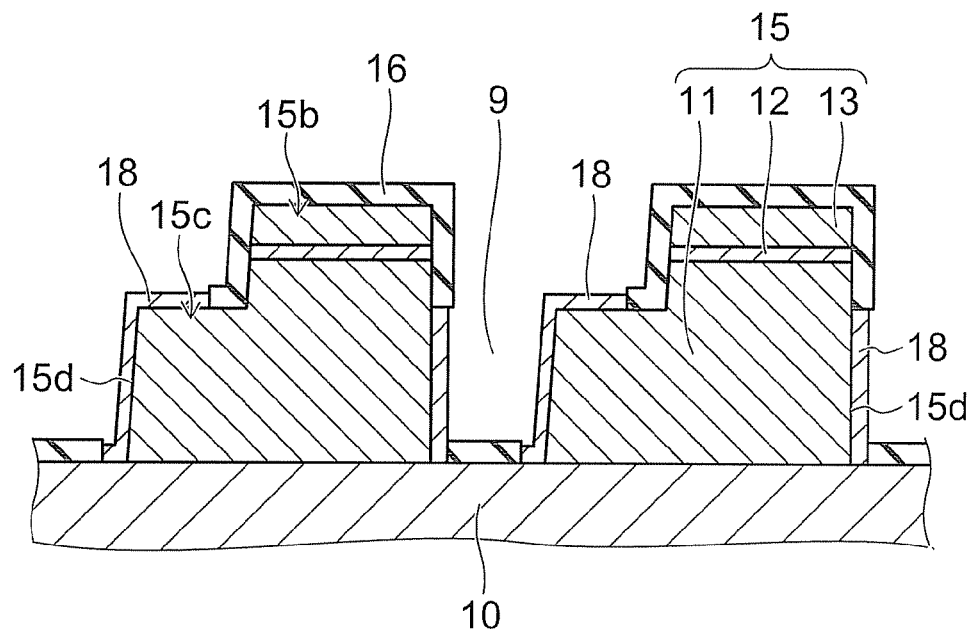

Then, an opening is selectively made in the insulating film 16 by, for example, wet etching to expose the side face 15d and the upper face (the second major surface) of the lower level portion 15c. Then, the n-side electrode 18 is formed as illustrated in FIG. 5A on the exposed portions by, for example, sputtering. At this time, the portions other than the portions where the n-side electrode 18 is formed are covered with a not-illustrated mask such as a resist. The n-side electrode 18 includes, for example, a nickel film formed on the first semiconductor layer 11 side and an aluminum film stacked on the nickel film.

Figure 5B:
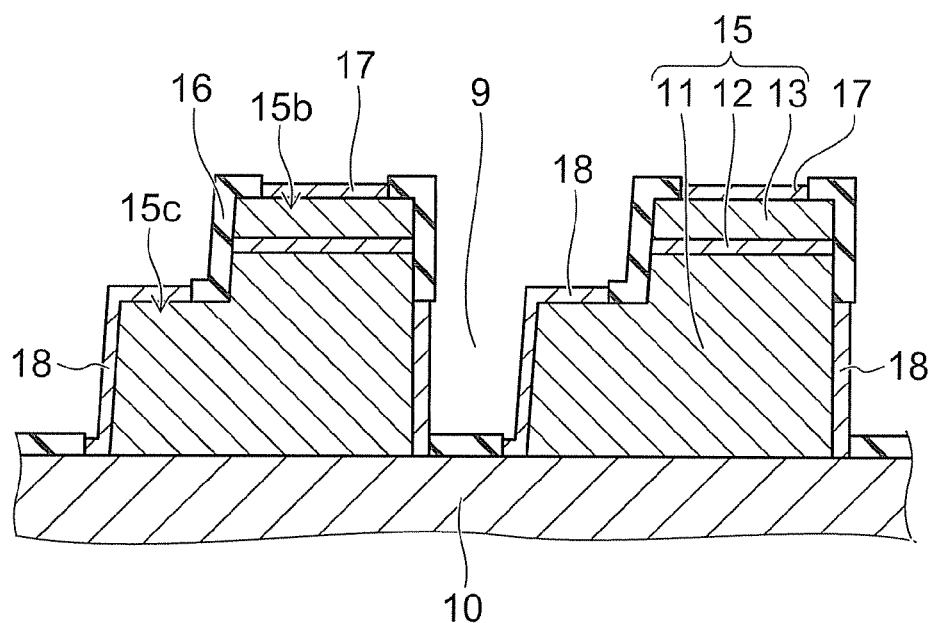

Next, an opening is selectively made in the insulating film 16 on the upper level portion 15b by, for example, wet etching to expose the upper face of the upper level portion 15b (the upper face of the second semiconductor layer 13). The p-side electrode 17 is formed as illustrated in FIG. 5B on the exposed portions by, for example, sputtering. At this time, the portions other than the portions where the p-side electrode 17 is formed are covered with a not-illustrated mask such as a resist. The p-side electrode 17 includes, for example, a nickel film formed on the second semiconductor layer 13 side and a gold film stacked on the nickel film.

The p-side electrode 17 may be formed prior to the n-side electrode 18; or the p-side electrode 17 and the n-side electrode 18 may be formed simultaneously from the same material.

In case the metal utilized as the p-side electrode 17 and the n-side electrode 18 are different, the manufacturing step is provided in two steps as in FIGS. 5A and 5B. However, in case the metal material is the same for the p-side electrode 17 and the n-side electrode 18, the manufacturing step may be one step. Namely, openings are formed in above a region to be formed the p-side electrode 17 and the n-side electrode 18 thereon.

Figure 6A:
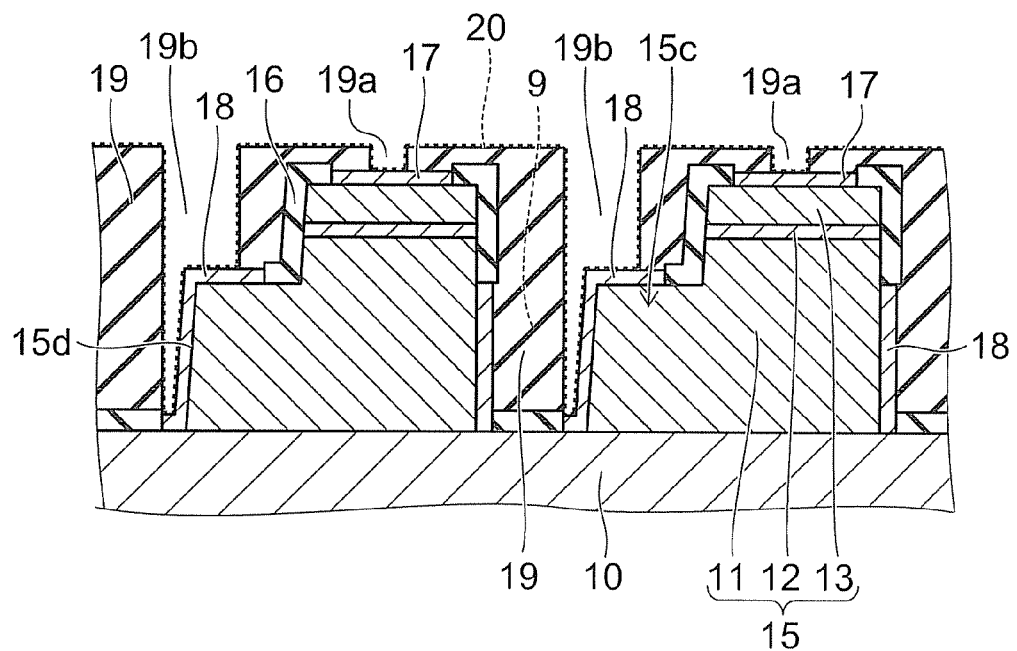

Then, after covering the exposed portions of the substrate 10 with the insulating layer 19, the insulating layer 19 is patterned as illustrated in FIG. 6A by, for example, wet etching to make the first opening 19a and the second opening 19b in the insulating layer 19. The insulating layer 19 is made of a resin such as, for example, polyimide having excellent patternability in ultra-fine patterns.

The first opening 19a reaches the p-side electrode 17. The second opening 19b reaches the n-side electrode 18 formed on the upper face of the lower level portion 15c. Further, the second opening 19b is made in the portion beside the side face 15d and communicates with the n-side electrode 18 formed on the side face 15d.

Then, a continuous seed metal 20 is formed on the upper face of the insulating layer 19 and on the inner faces of the first opening 19a and the second opening 19b; and after forming a not-illustrated plating resist, Cu plating is performed using the seed metal 20 as a current path. The seed metal 20 includes, for example, Cu.

Figure 6B:
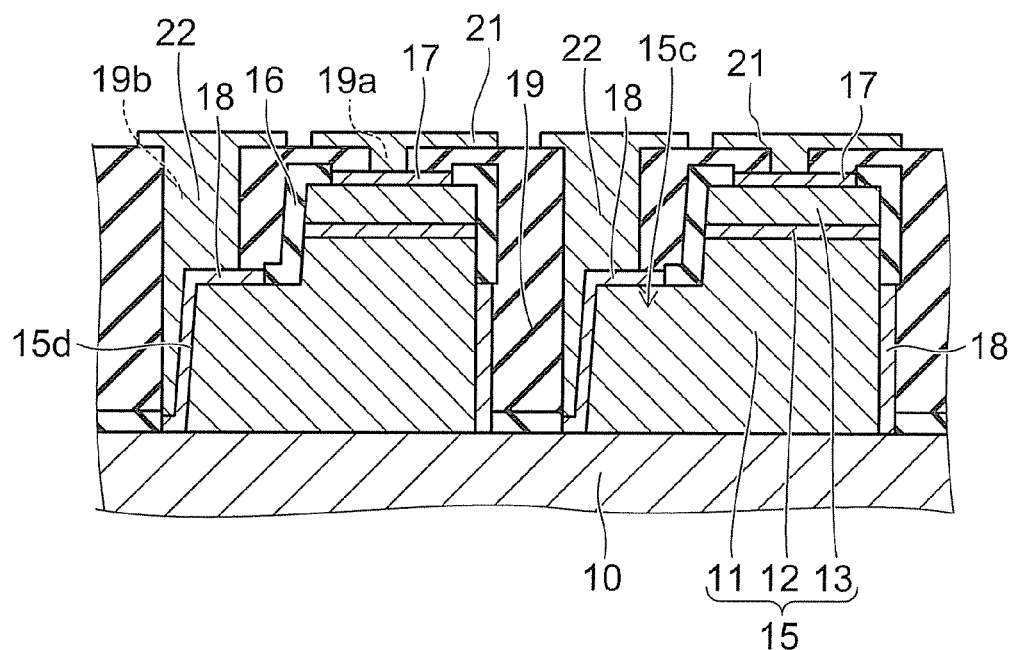

Thereby, as illustrated in FIG. 6B, the p-side interconnect layer 21 and the n-side interconnect layer 22 are formed selectively on the insulating layer 19. The p-side interconnect layer 21 and the n-side interconnect layer 22 are formed simultaneously by plating. The p-side interconnect layer 21 is formed also in the first opening 19a to connect to the p-side electrode 17. The n-side interconnect layer 22 is formed also in the second opening 19b to connect to the n-side electrode 18.

The side face 15d is obtained when making the separating trench 9 described above referring to FIG. 3B. The separating trench 9 is made by RIE using a resist film selectively formed on the semiconductor layer 15 as a mask. At this time, the resist film is consumed isotropically in the film thickness direction and the planar direction; and the planar size of the resist film is reduced as the etching progresses. Accordingly, the width of the separating trench 9 gradually decreases in the depth direction. Accordingly, each of the cross-sectional configurations of the multiply subdivided semiconductor layer 15 on the substrate 10 is a trapezoidal configuration; and the side face 15d adjacent to the separating trench 9 is tapered with respect to the first major surface 15a and the second major surface.

Therefore, the width of the portion of the second opening 19b beside the side face 15d is wider upward; and it is possible to reliably form the seed metal 20 and the n-side interconnect layer 22 to the bottom of the second opening 19b.

Figure 7A:
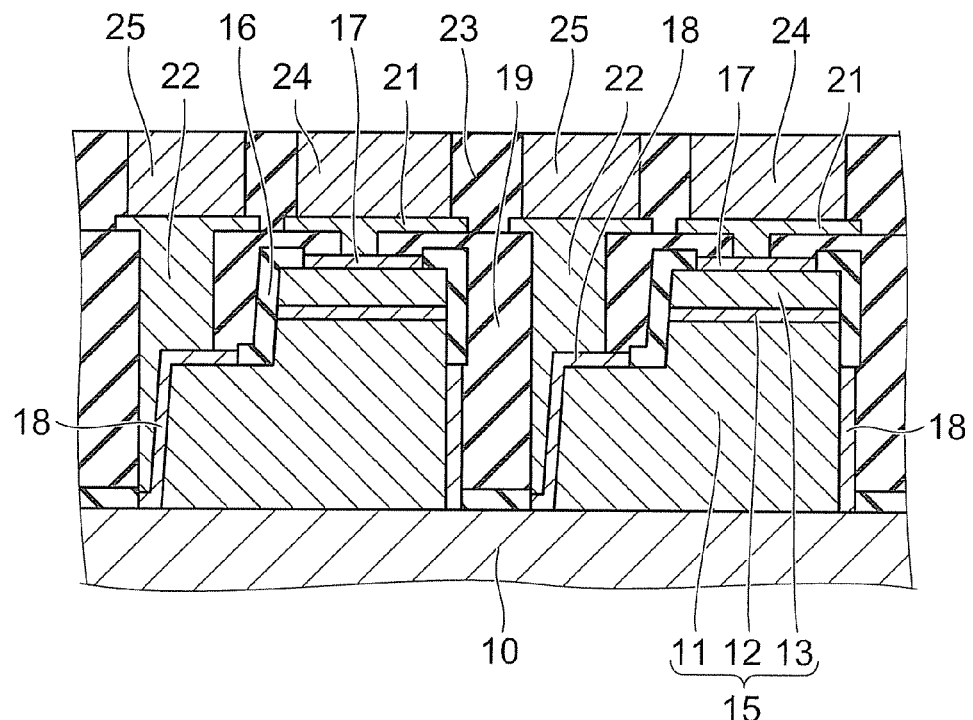

The plating resist used during the plating of the p-side interconnect layer 21 and the n-side interconnect layer 22 is removed by a chemical solution. Subsequently, another plating resist (not illustrated) is formed for forming the metal pillars; and Cu plating is performed using the seed metal 20 described above as a current path. Thereby, as illustrated in FIG. 7A, the p-side metal pillar 24 is formed above the p-side interconnect layer 21; and the n-side metal pillar 25 is formed above the n-side interconnect layer 22. The p-side metal pillar 24 and the n-side metal pillar 25 are formed simultaneously by plating.

Subsequently, the plating resist for forming the metal pillars is removed by a chemical solution; and the exposed portions of the seed metal 20 also are removed. Thereby, the electrical connection between the p-side interconnect layer 21 and the n-side interconnect layer 22 via the seed metal 20 is divided.

Then, the p-side interconnect layer 21, the n-side interconnect layer 22, the p-side metal pillar 24, and the n-side metal pillar 25 are covered with the resin layer 23. Subsequently, the surface of the resin layer 23 is polished to expose the end faces (the upper faces) of the p-side metal pillar 24 and the n-side metal pillar 25.

Subsequently, the substrate 10 is removed. The substrate 10 may be removed by, for example, laser lift-off. Specifically, laser light is irradiated from the backside of the substrate 10 toward the first semiconductor layer 11. The substrate 10 is permeable to laser light; and the laser light has a wavelength in the absorption region of the first semiconductor layer 11.

When the laser light reaches the interface between the substrate 10 and the first semiconductor layer 11, the first semiconductor layer 11 proximal to the interface absorbs the energy of the laser light and decomposes. For example, in the case where the first semiconductor layer 11 is GaN, the first semiconductor layer 11 decomposes into Ga and nitrogen gas. A micro gap is formed between the substrate 10 and the first semiconductor layer 11 by the decomposition reaction; and the substrate 10 and the first semiconductor layer 11 separate. The irradiation of the laser light is performed over the entire wafer by performing multiply for each set region; and the substrate 10 is removed.

Here, the layer made of the resin and the metal is flexible, and the metal is formed by plating at near room temperature. Hence, the residual stress occurring with respect to the translucent substrate 10 is relatively low.

In the conventional technique for separating the semiconductor layer from the translucent substrate at wafer level, for example, it is bonded to a silicon substrate with a metal layer formed thereon using Au—Sn solder at a high temperature of 300° C. or more, and then the semiconductor layer made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle semiconductor layer.

In contrast, in this embodiment, the residual stress is low, and the semiconductor layer 15 is separated in the state of being fixed to a flexible support. Hence, the device can be manufactured at high yield without trouble such as cracking in the semiconductor layer 15.

Figure 7B:
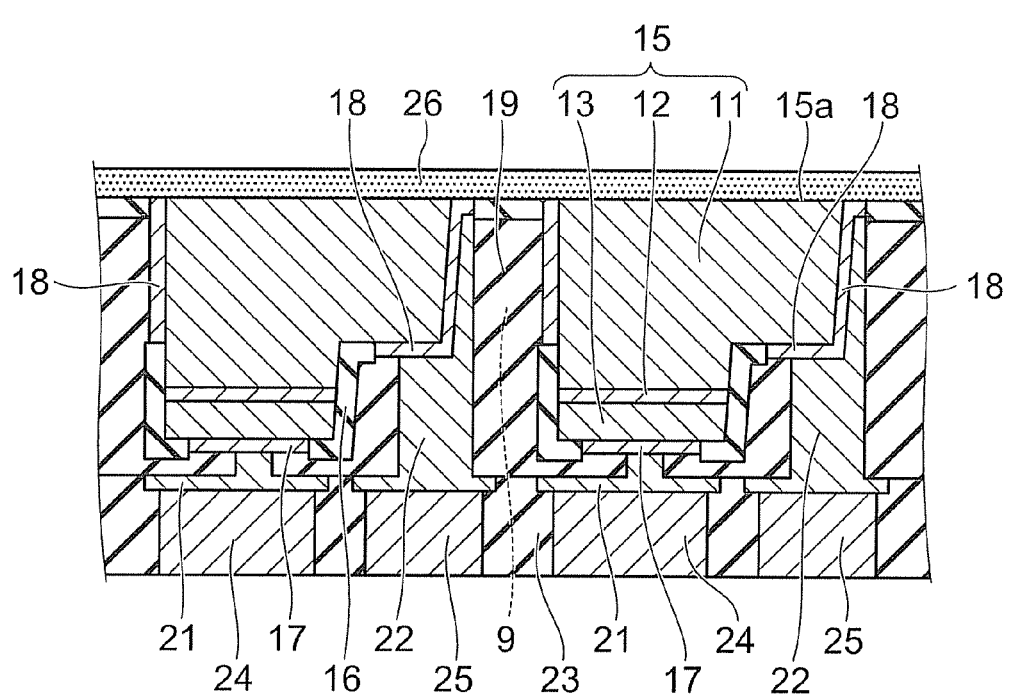

After removing the substrate 10, the fluorescent layer 26 is formed on the first major surface 15a as illustrated in FIG. 7B. The fluorescent layer 26 may be formed, for example, by coating a liquid resin in which phosphor particles are mixed by spin coating and then thermosetting.

By forming the fluorescent layer 26 after removing the substrate 10 from the first major surface 15a, the substrate 10 does not exist between the first major surface 15a and the fluorescent layer 26; and the light extraction efficiency can be increased.

Subsequently, dicing is performed to obtain the singulated semiconductor light emitting device illustrated in FIG. 1A. During the dicing, the substrate 10 is already removed; and in the separating trench 9 which is the dicing region, the semiconductor layer 15 does not exist and the insulating layer 19 which is a resin is filled. Accordingly, the dicing is easy because the insulating layer 19, which is a resin, and the resin layer 23 are cut; and the productivity can be improved. Further, damage to the semiconductor layer 15 during the dicing can be avoided. Also, a structure is obtained after singulation in which the periphery of the device is covered with resin and protected.

The singulated semiconductor light emitting device may have a single-chip structure including one semiconductor layer 15 or a multi-chip structure including multiple semiconductor layers 15.

Because the processes described above up to the dicing are performed collectively in the wafer state, it is unnecessary to perform interconnections and packaging for each of the singulated devices; and it is possible to drastically reduce production costs. The interconnections and the packaging are already complete in the singulated state. Moreover, downsizing is easy in the case where the planar size of each device approaches the planar size of the bare chip (the semiconductor layer 15). Also, inspections are possible at the wafer level. Therefore, the productivity can be increased. As a result, cost reductions are easy.

Second Embodiment

Figure 8A:
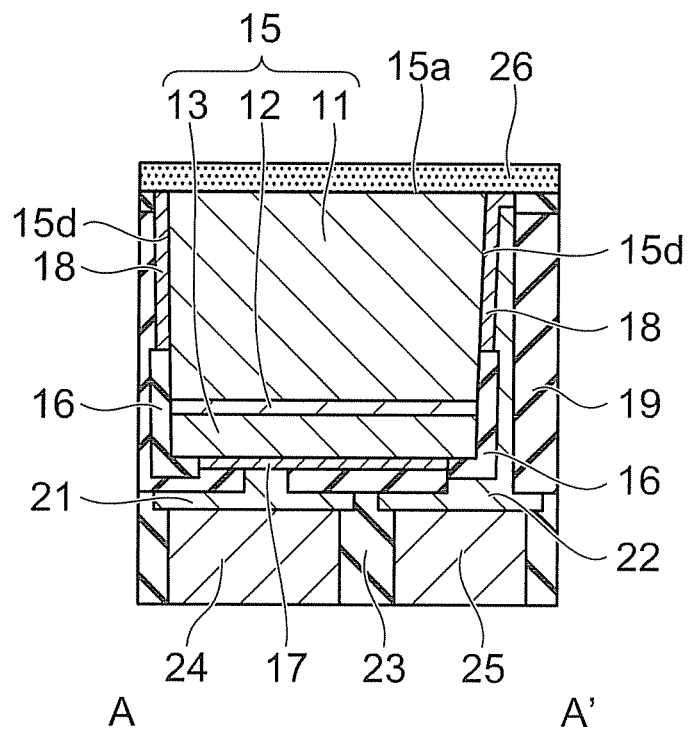
FIGS. 8A and 8B are schematic views of a semiconductor light emitting device of a second embodiment.
Figure 8B:
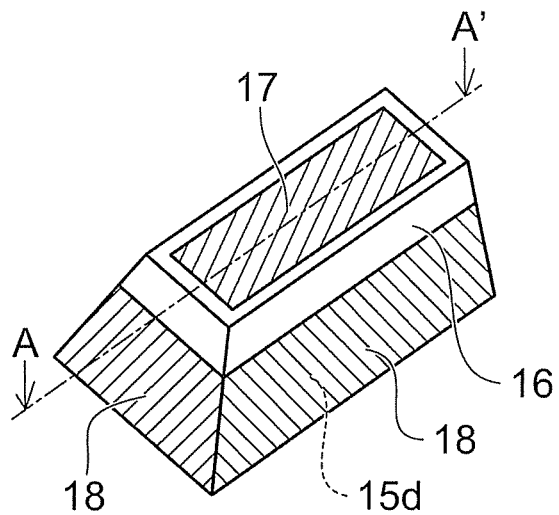

FIG. 8A is a schematic cross-sectional view of a semiconductor light emitting device of a second embodiment. FIG. 8B is a schematic perspective view of the semiconductor layer 15 and the electrodes 17 and 18 of the semiconductor light emitting device. In FIG. 8A, the first major surface 15a of the semiconductor layer 15 is illustrated on the upper side; and in FIG. 8B, the first major surface 15a is illustrated on the lower side.

Figure 9:
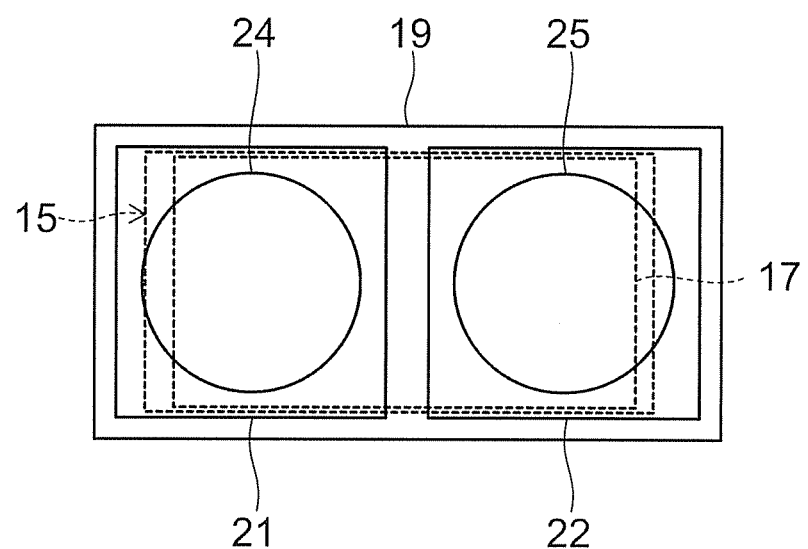
FIG. 9 is a schematic plane view illustrating a planar layout of electrodes, interconnect layers, and metal pillars of the semiconductor light emitting device of the second embodiment.

FIG. 9 illustrates one example of a planar layout of the semiconductor layer 15 (shown as broken line in FIG. 9), the p-side electrode 17 (shown as broken line in FIG. 9), the p-side interconnect layer 21, the n-side interconnect layer 22, the p-side metal pillar 24, and the n-side metal pillar 25 of this embodiment. FIG. 9 corresponds to a plan view as viewed from the lower face (the mounting surface) side of FIG. 8A. The resin layer 23 is not illustrated.

In this embodiment as well, the n-side electrode 18 is formed on the side face 15d of the first semiconductor layer 11 between the first major surface 15a and the light emitting layer 12 of the semiconductor layer 15. Thereby, the surface area reduction of the p-side electrode 17 can be suppressed; the luminance can be increased; and the reliability can be increased by increasing the surface area of the n-side electrode 18. Further, the light leakage from the side face 15d can be prevented; and the uneven colors and the uneven luminance can be suppressed. Also, the amount of light reflected by the side face and extracted from the first major surface 15a side can be increased; and the luminance can be increased.

In this embodiment, the n-side electrode 18 is not provided on the second major surface and is provided only on the side face 15d. Accordingly, as illustrated in FIG. 8B and FIG. 9, the surface area of the p-side electrode 17 provided on the second major surface can be greater; and a larger light emitting region can be obtained. Thereby, the luminous efficacy can be increased. Because the processes described above and illustrated in FIG. 4A that expose the second major surface of the first semiconductor layer 11 can be omitted, cost reductions also are possible.

Third Embodiment

Figure 10A:
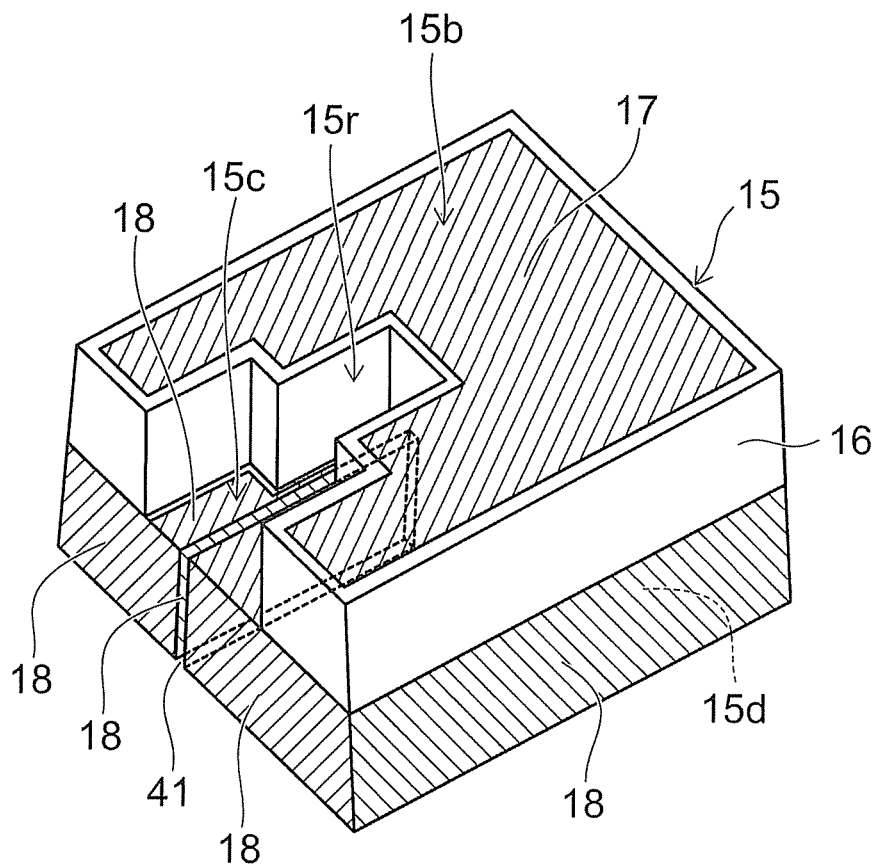
FIGS. 10A and 10B are schematic views of a semiconductor light emitting device of a third embodiment.

FIG. 10A is a schematic perspective view of the semiconductor layer 15 and the electrodes 17 and 18 of a semiconductor light emitting device of a third embodiment.

Figure 10B:
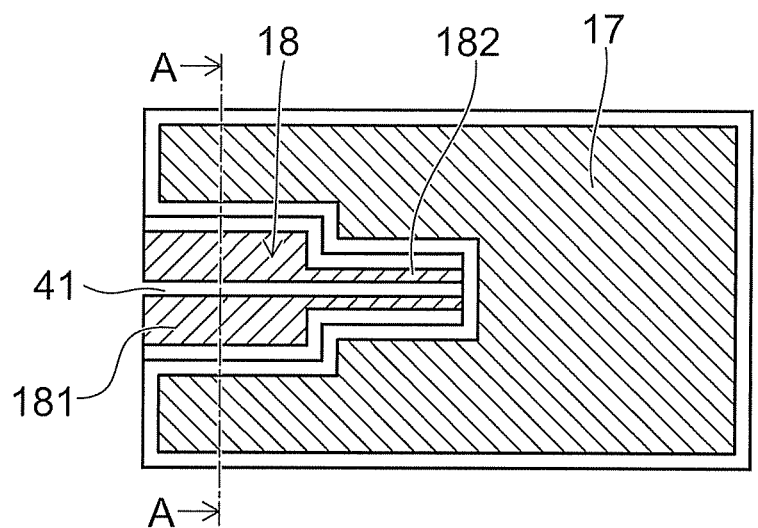

FIG. 10B corresponds to a plan view of FIG. 10A.

Figure 11A:
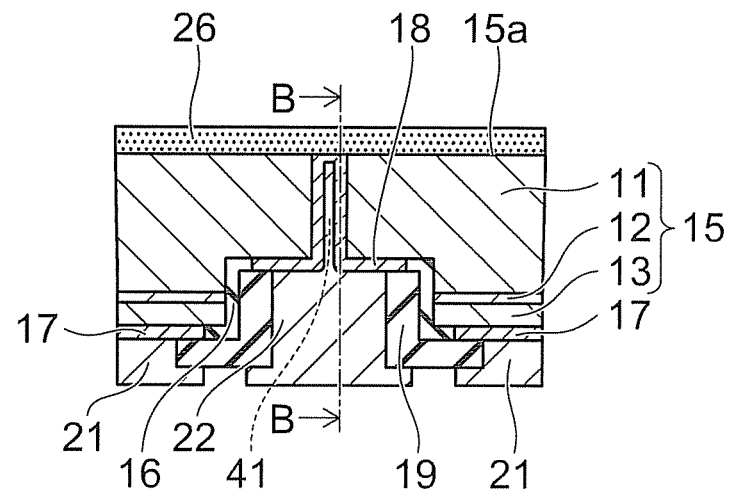
FIGS. 11A and 11B are schematic cross-sectional views of the semiconductor light emitting device of the third embodiment.

FIG. 11A corresponds to a cross section along A-A of FIG. 10B.

Figure 11B:
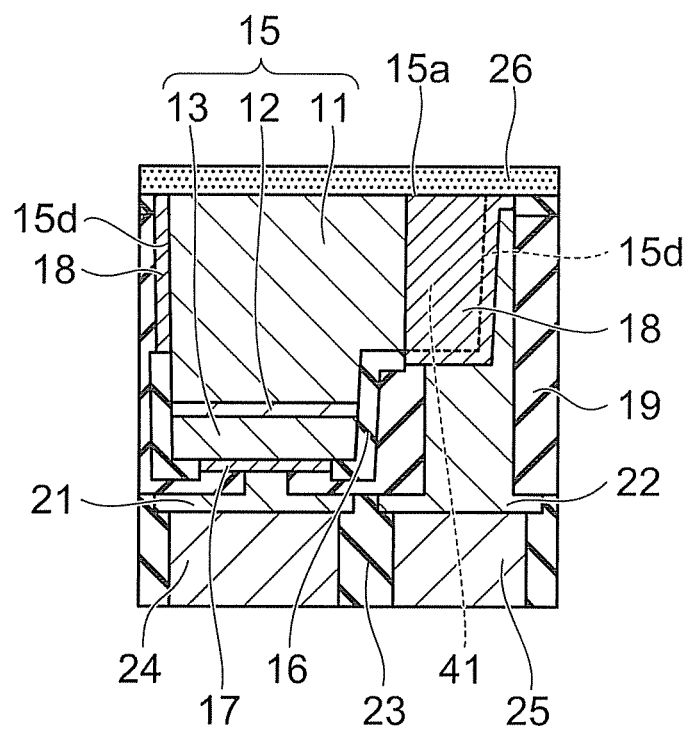

FIG. 11B corresponds to a cross section along B-B of FIG. 11A.

Figure 12:
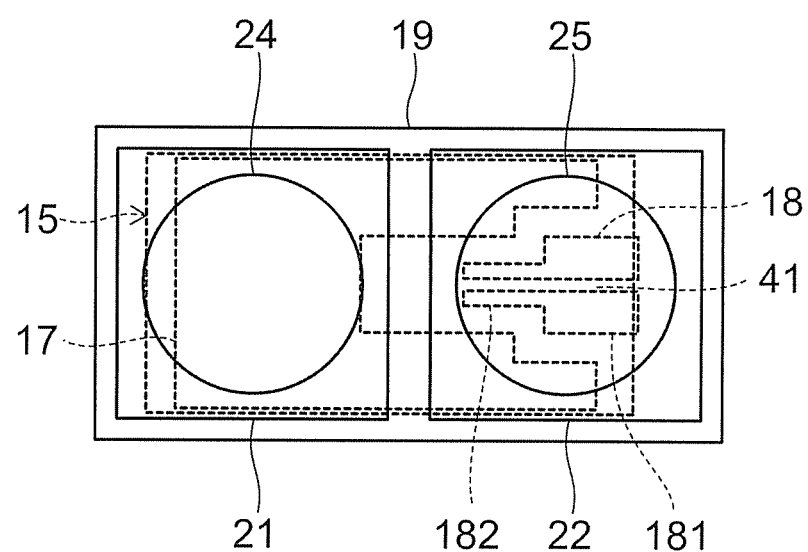
FIG. 12 is a schematic plane view illustrating a planar layout of electrodes, interconnect layers, and metal pillars of the semiconductor light emitting device of the third embodiment.

FIG. 12 illustrates one example of a planar layout of the semiconductor layer 15, the p-side electrode 17, the n-side electrode 18, the p-side interconnect layer 21, the n-side interconnect layer 22, the p-side metal pillar 24, and the n-side metal pillar 25 of this embodiment. FIG. 12 corresponds to a plan view as viewed from the lower face (the mounting surface) side of FIG. 11B. The resin layer 23 is not illustrated.

On the second major surface of the semiconductor layer 15, the layout of the p-side electrode 17 has a surface area greater than that of the n-side electrode 18. The n-side interconnect layer 22 is formed to spread over the insulating layer 19 with a surface area greater than that of the portion of the n-side electrode 18 provided on the second major surface.

In this embodiment as well, the n-side electrode 18 is formed on the side face 15*d* and the upper face (the second major surface) of the lower level portion 15*c* of the semiconductor layer 15. In this embodiment, a trench 41 is formed in the lower level portion 15*c*. The trench 41 is formed from the second major surface of the lower level portion 15*c* to reach the substrate 10 in a state in which the semiconductor layer 15 is formed on the substrate 10. In other words, the trench 41 reaches the first major surface 15*a* from the second major surface of the lower level portion 15*c*. The trench 41 pierces the n-type semiconductor layer 11. The n-side electrode 18 is formed also on the side face of the trench 41.

In addition to the side face 15*d* which is the outer circumferential face of the lower level portion 15*c*, the n-side electrode 18 is formed also on the side face of the trench 41. Thereby, the region of the n-side electrode 18 on the second major surface can be reduced. The surface area of the p-side electrode 17 on the second major surface can be relatively increased; and the luminous efficacy can be increased.

In this embodiment, the semiconductor layer 15 has a recess portion 15*r* toward longitudinal direction. The recess portion 15*r* is set back one move step with comparing to the semiconductor light emitting device shown in FIGS. 1A, 1B and 2. Further, the semiconductor layer 15 is two step recesses, in which one is wide and provided outside and the other recess portion 15*r* is narrow, as shown in FIGS. 10A and 10B. In the recess portion 15*r*, a protruded portion 182 of the n-side electrode 18 is formed. As shown in FIG. 10B, the n-side electrode 18 has a protrusion portion 182 toward the p-side electrode 17 in longitudinal direction (horizontal direction in FIG. 10B) of the semiconductor light emitting device.

The n-side electrode 18 includes a wide portion 181 and a narrow (protruded) portion 182. The wide portion 181 is similar to the n-side electrode 18 in FIGS. 1A, 1B and 2.

The trench 41 is formed from the lower level portion 15*c* and the recess portion 15*r* to the first major surface 15*a*. The trench 41 has a line shape in a plan view in FIG. 10B, and uniform width, in this embodiment. The protrusion portion 182 is protruded a bottom of the U shape of the p-side electrode 17 as in FIGS. 10B and 12.

In this embodiment as well, the light leakage from the side face 15*d* can be prevented; and the uneven colors and the uneven luminance can be suppressed. Further, the amount of the light reflected by the side face and extracted from the first major surface 15*a* side can be increased; and the luminance can be increased.

As illustrated in FIG. 11A, the n-side electrode 18 is formed also on the bottom portion of the trench 41. The n-side electrode 18 is formed on the bottom portion of the trench 41, i.e., the major surface of the substrate 10, in the state in which the semiconductor layer 15 is formed on the substrate 10. Therefore, the fluorescent layer 26 does not enter the trench 41 when forming the fluorescent layer 26 on the first major surface 15*a* after removing the substrate 10; and the fluorescent layer 26 can be formed with a uniform thickness.

The n-side interconnect layer 22 is filled also on the inner side of the n-side electrode 18 in the trench 41. Accordingly, the n-side electrode 18 and the n-side interconnect layer 22 are in contact also inside the trench 41. Therefore, the contact surface area between the n-side electrode 18 and the n-side interconnect layer 22 can be increased; and the contact resistance can be reduced.

The trench 41 is made from the second major surface of the lower level portion 15*c* to reach the first major surface 15*a* on the side opposite to the second major surface. The substrate 10 forms a stopper when patterning the trench 41; and the trench 41 can be obtained with a constant depth. Therefore, characteristic variations due to variation of the contact surface area between the n-side electrode 18 and the first semiconductor layer 11 via the side face of the trench 41 can be prevented.

As shown in FIG. 12, the n-side metal pillar 25 is provided above (beneath) the wide portion 181 and the narrow protruded portion 182 of the n-side electrode 18.

In this embodiment, the narrow protruded portion 182 of the n-side electrode 18 is provided. Therefore, a radiative recombination is generated around a center of the semiconductor light emitting device. Furthermore, the trench 41 is formed and the n-side electrode 18 is formed on the side surface of the trench 41. Thus, a current pass from the p-side electrode 17 to the n-side electrode 18 is spread and optical output may be improved.

Fourth Embodiment

Figure 13A:
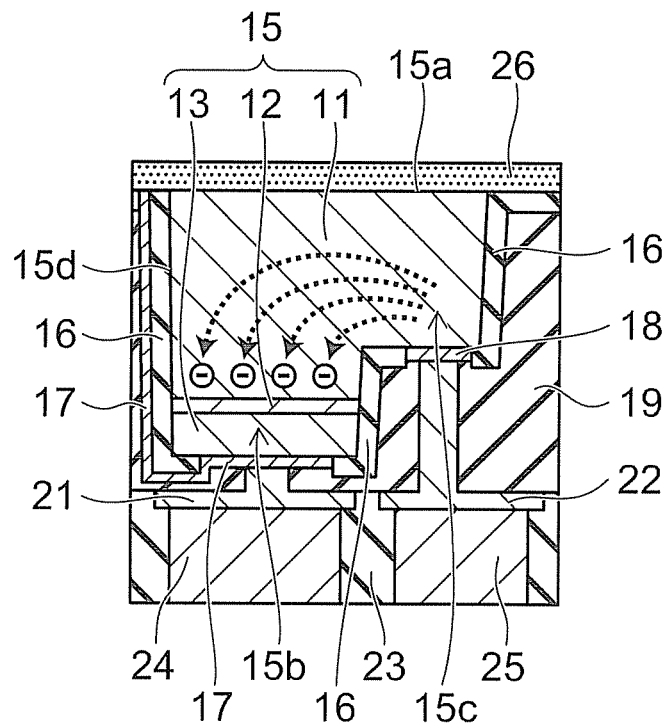
FIGS. 13A and 13B are schematic views of a semiconductor light emitting device of a fourth embodiment.
Figure 13B:
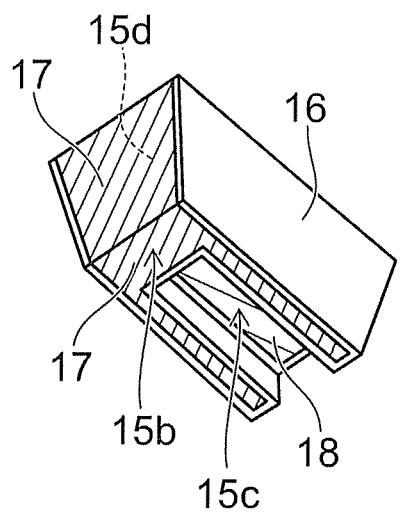

FIG. 13A is a schematic cross-sectional view of a semiconductor light emitting device of a fourth embodiment. FIG. 13B is a schematic perspective view of the semiconductor layer 15 and the electrodes 17 and 18 of the semiconductor light emitting device.

Figure 14:
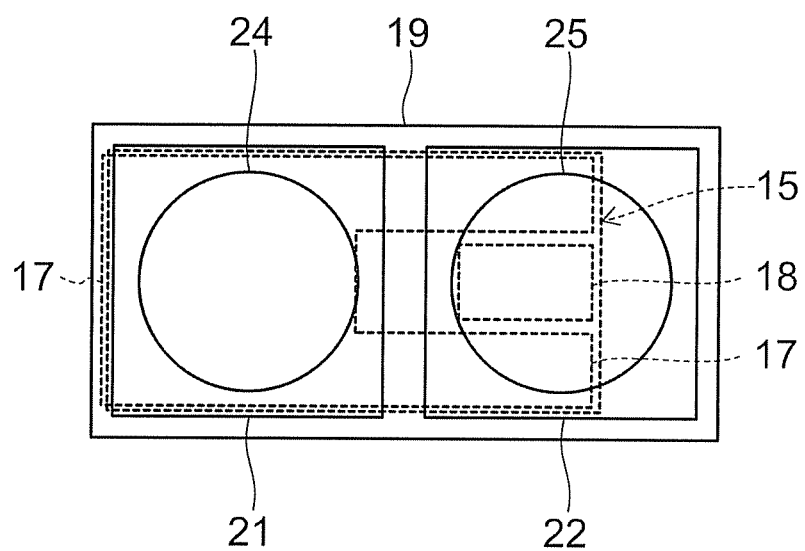
FIG. 14 is a schematic plane view illustrating a planar layout of electrodes, interconnect layers, and metal pillars of the semiconductor light emitting device of the fourth embodiment.

FIG. 14 illustrates one example of a planar layout of the semiconductor layer 15, the p-side electrode 17, the n-side electrode 18, the p-side interconnect layer 21, the n-side interconnect layer 22, the p-side metal pillar 24, and the n-side metal pillar 25 of this embodiment. FIG. 14 corresponds to a plan view as viewed from the lower face (the mounting surface) of FIG. 13A. The resin layer 23 is not illustrated.

The layout of the p-side electrode 17 on the second major surface of the semiconductor layer 15 has a surface area greater than that of the n-side electrode 18. The n-side interconnect layer 22 is formed to spread over the insulating layer 19 with a surface area greater than that of the n-side electrode 18 provided on the second major surface.

The p-side electrode 17 is provided on the second major surface of the upper level portion 15*b* including the light emitting layer 12; and the n-side electrode 18 is provided on the second major surface of the lower level portion 15*c* provided outside the outer circumference of the light emitting layer 12.

In this embodiment, the p-side electrode 17 is provided also on the side face 15*d* side of the semiconductor layer 15. The insulating film 16 is formed on the side face 15*d*; and the p-side electrode 17 is provided also on the insulating film 16 provided on the side face 15*d*.

The p-side electrode 17 is provided via the insulating film 16 on the side face 15*d* on the side opposite to the lower level portion 15*c* with the upper level portion 15*b* between the side face 15*d* and the lower level portion 15*c*. The p-side electrode 17 is formed continuously from the second major surface of the upper level portion 15*b* to the side face 15*d* side.

A high potential (a positive potential) with respect to the n-side electrode 18 may be applied to the p-side electrode 17. Then, electrons injected from the n-side electrode 18 into the first semiconductor layer 11 are attracted by the potential of the p-side electrode 17 provided on the side face 15*d* side; and the electrons can be efficiently injected even into the portions of the light emitting layer 12 distal to the n-side electrode 18 as illustrated by the broken-line arrows of FIG. 13A.

Accordingly, the concentration of the electrons in the side of the light emitting layer 12 proximal to the n-side electrode 18 can be suppressed; the current distribution in the surface direction of the light emitting layer 12 can be uniform; and a local increase of the current density can be suppressed. In other words, the electrons contribute more efficiently to the light emission; and the luminous efficacy increases.

Although the n-side electrode 18 is provided only on the second major surface in the structure illustrated in FIGS. 13A and 13B, the n-side electrode 18 may be formed on the side face of the lower level portion 15c similarly to the embodiments described above. In such a case, the p-side electrode 17 and the n-side electrode 18 are separated from each other by an insulating film such that the electrodes 17 and 18 do not contact each other on the side face 15d.

In the embodiments described above, the substrate 10 may not be removed entirely; and the substrate 10 may be polished to thinly remain on the first major surface 15a. By leaving the substrate 10 in a thin layer, the mechanical strength can be higher than that of the structure in which the substrate 10 is entirely removed; and a structure having high reliability can be provided. The remaining substrate 10 can suppress warp after singulation; and the mounting onto the circuit substrate and the like is easy.

A red fluorescent layer may contain, for example, a nitride-based phosphor of $CaAlSiN_3$:Eu or a SiAlON-based phosphor.

In the case where a SiAlON-based phosphor is used, it may be used

   Compositional Formula (1)

where M is at least one type of metal element excluding Si and Al, and it may be desirable for M to be at least one selected from Ca and Sr; R is a light emission center element, and it may be desirable for R to be Eu; and x, a1, b1, c1, and d1 satisfy the relationships $0<x\leq1$, $0.6<a1<0.95$, $2<b1<3.9$, $0.25<c1<0.45$, and $4<d1<5.7$.

By using the SiAlON-based phosphor of Compositional Formula (1), the temperature characteristics of the wavelength conversion efficiency can be improved; and the efficiency in the high current density region can be improved further.

A yellow fluorescent layer may contain, for example, a silicate-based phosphor of $(Sr, Ca, Ba)_2SiO_4$:Eu.

A green fluorescent layer may contain, for example, a halophosphate-based phosphor of $(Ba, Ca, Mg)_{10}(PO_4)_6 \cdot Cl_2$:Eu or a SiAlON-based phosphor.

In the case where a SiAlON-based phosphor is used, it may be used

   Compositional Formula (2)

where M is at least one type of metal element excluding Si and Al, and it may be desirable for M to be at least one selected from Ca and Sr; R is a light emission center element, and it may be desirable for R to be Eu; and x, a2, b2, c2, and d2 satisfy the relationships $0<x\leq1$, $0.93<a2<1.3$, $4.0<b2<5.8$, $0.6<c2<1$, and $6<d2<11$.

By using the SiAlON-based phosphor of Compositional Formula (2), the temperature characteristics of the wavelength conversion efficiency can be improved; and the efficiency in the high current density region can be improved further.

A blue fluorescent layer may contain, for example, an oxide-based phosphor of $BaMgAl_{10}O_{17}$:Eu.

According to this embodiment, the method for manufacturing the semiconductor light emitting device includes:

forming a semiconductor layer on a substrate, the semiconductor layer including a light emitting layer, a first major surface, and a second major surface formed on a side opposite to the first major surface;

making a separating trench on the substrate to multiply separate the semiconductor layer;

forming a first electrode on the second major surface of the semiconductor layer;

forming a second electrode on a side face adjacent to the separating trench, the side face being a portion between the first major surface and the light emitting layer of the semiconductor layer;

forming a first insulating layer to cover the first electrode and the second electrode on the second major surface side of the semiconductor layer;

making a first opening in the first insulating layer to reach the first electrode and making a second opening in the first insulating layer to reach the second electrode provided on the side face;

forming a first interconnect layer in the first opening and on the first insulating layer on a side opposite to the second major surface;

forming a second interconnect layer in the second opening and on the first insulating layer on the side opposite to the second major surface;

forming the first metal pillar on a face of the first interconnect layer on a side opposite to the first electrode;

forming a second metal pillar on a face of the second interconnect layer on a side opposite to the second electrode; and forming a second insulating layer to cover a periphery of the first metal pillar and a periphery of the second metal pillar.

The manufacturing method further includes forming an upper level portion including the light emitting layer and a lower level portion not including the light emitting layer on the second major surface side of the semiconductor layer.

The second electrode is formed on a side face of the lower level portion.

The second electrode is formed also on an upper face of the lower level portion.

The manufacturing method further includes making a trench to pierce the lower level portion and reach the substrate; and the second electrode is formed also on a side face of the trench.

A resin is filled as an insulating layer into the separating trench; and singulation is performed by cutting the resin in the separating trench.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
a first semiconductor layer including a first major surface, and a second major surface opposite to the first major surface;
a second semiconductor layer;
a light emitting layer provided between the second major surface of the first semiconductor layer and the second semiconductor layer;

a first electrode provided on a surface of the second semiconductor layer;

a second electrode provided on a side face of the first semiconductor layer, being in contact with the side face of the first semiconductor layer, and the side face of the first semiconductor layer joining the first major surface and the second major surface;

a first insulating layer provided on the second major surface of the first semiconductor layer and on the surface of the second semiconductor layer, the first insulating layer having a first opening reaching the first electrode and a second opening reaching the second electrode provided on the side face of the first semiconductor layer;

a first interconnect layer provided in the first opening to connect to the first electrode;

a second interconnect layer provided in the second opening to connect to the second electrode;

a first metal pillar provided on a face of the first interconnect layer on a side opposite to the first electrode;

a second metal pillar provided on a face of the second interconnect layer on a side opposite to the second electrode; and a second insulating layer provided between the first metal pillar and the second metal pillar.

2. The device of claim 1, wherein the second electrode is provided to continuously enclose the side face of the first semiconductor layer.

3. The device of claim 1, wherein the second electrode is provided also on the second major surface of the first semiconductor layer.

4. The device of claim 3, wherein a surface area of the second electrode on the side face of the first semiconductor layer is greater than a surface area of the second electrode on the second major surface of the first semiconductor layer.

5. The device of claim 3, wherein the first electrode has a U shape in a plan view, and a portion of the second electrode is provided in an opening of the U shape in a plan view.

6. The device of claim 5, wherein the second electrode has a protrusion portion on the second major surface toward a bottom of the U shape in a plan view.

7. The device of claim 3, wherein a face of the second interconnect layer on a side opposite to the second electrode on the second major surface is larger than a face of the second interconnect layer connected to the second electrode on the second major surface.

8. The device of claim 3, wherein a surface area of a portion of the second electrode provided on the side face of the first semiconductor layer is greater than a surface area of a portion of the second electrode provided on the second major surface.

9. The device of claim 1, wherein the first electrode has a U shape in a plan view, a portion of the second electrode is provided in an opening of the U shape in a plan view, and the second electrode has a protrusion portion on the second major surface toward a bottom of the U shape in a plan view.

10. The device of claim 1, wherein
the side face of the first semiconductor layer is tapered with respect to the first major surface and the second major surface, and
a width of a portion of the second interconnect layer beside the side face of the first semiconductor layer gradually increases from the first major surface side toward the second major surface side.

11. The device of claim 1, wherein each of a thickness of the first metal pillar and a thickness of the second metal pillar is thicker than a thickness of a stacked body including the first semiconductor layer, the light emitting layer and the second semiconductor layer.

* * * * *